Sapunarow et al.   [45] July 12, 1977

[54] PROCESS FOR PRODUCING A MULTI-CHIP WIRING ARRANGEMENT

[75] Inventors: Michail Sapunarow; Wolfgang Bade, both of Munich, Germany

[73] Assignee: Siemens Aktiengesellschaft, Berlin & Munich, Germany

[21] Appl. No.: 609,688

[22] Filed: Sept. 2, 1975

[30] Foreign Application Priority Data

Sept. 10, 1974  Germany .......................... 2443245

[51] Int. Cl.$^2$ ......................................... B41M 3/08
[52] U.S. Cl. ............................... 29/625; 174/68.5; 427/96; 427/98; 361/397
[58] Field of Search ............ 29/625, 624, 626, 577; 427/96, 97, 98, 99, 123, 124, 125, 126, 127; 204/15, 20, 38 R, 40, 41; 174/68.5; 317/101 B, 101 C

[56] References Cited

U.S. PATENT DOCUMENTS

| 3,619,725 | 11/1971 | Soden et al. | 427/96 X |
| 3,672,986 | 6/1972 | Schneble et al. | 427/98 X |
| 3,773,554 | 11/1973 | Scrutton et al. | 427/126 |
| 3,808,049 | 4/1974 | Caley et al. | 427/96 |

OTHER PUBLICATIONS

IBM J. Res. Develop., SLT Device and its Monolithic Extension, vol. 13, No. 3, May 1969, pp. 226–238.

Primary Examiner—James R. Duzan
Attorney, Agent, or Firm—Hill, Gross, Simpson, Van Santen, Steadman, Chiara & Simpson

[57] ABSTRACT

A process for producing multi-chip wiring which facilitates high packing density and reliable flip-chip connections. In the process, an adhesive layer and a contact layer are vapor deposited onto a carrier. The desired structure of the connector path, outer contacts and connection surfaces are covered with a conductive layer and an intermediate layer with the aid of a first photo-lacquer mask by galvanic metal deposition. A solder-rejecting layer is galvanically deposited onto the structure of the conductor paths with the aid of a second photo-lacquer mask. The undesired regions of the adhesive layer and of the contact layer are etched away and the outer contacts and connection surfaces are covered with a solderable contact layer by selective currentless metal deposition.

9 Claims, 6 Drawing Figures

PROCESS FOR PRODUCING A MULTI-CHIP WIRING ARRANGEMENT

BACKGROUND OF THE INVENTION

1. Description of the Prior Art

Multi-chip-wiring for semiconductor modules featuring soft connection pads which have been adopted for industrial use contain two semiconductor modules on a ceramic carrier which is provided with copper pins (IBM Journal of Research and Development, Vol., 13, No. 3, May 1969, p. 228, FIG. 4). The wiring on the ceramic carrier is a two-sided thick layer wiring which is established by pressing silk-screen printing paste onto the upper and the lower sides of the carrier. The pins required for the subsequent wiring of the carrier simultaneously serve as connections between the two wiring layers.

2. Field of the Invention

The field of art to which this invention pertains is processes for producing multi-chip wiring on an insulation carrier which has outer contacts for additional wiring and connection surfaces for soldering semi-conductor modules in the flip-chip-technique.

SUMMARY OF THE INVENTION

It is an important feature of the present invention to provide an improved process to produce multi-chip wiring on an insulation carrier.

It is another feature of the present invention to provide a process for producing multi-chip wiring on an insulation carrier which facilitates high packing density and reliable flip-chip connections.

It is an object of the present invention to provide a process for producing multi-chip wiring as described above which utilizes an adhesive layer and a contacting layer, both vapor deposited or atomized onto the carrier and wherein the desired conductor paths, outer contacts and connection surfaces are covered with a conductive layer and an intermediate layer with the aid of a first photo lacquer mask by galvanic metal deposition.

It is another object of the present invention to provide a process as described above wherein a solder-rejecting layer is galvanically deposited onto the structure of the conductor paths with the aid of a second photo-lacquer mask and wherein the undesired regions of the adhesive layer and of the contacting layer are etched away.

These and other objections, features, and advantages of the present invention will be understood in greater detail from the following description and the associated drawings wherein reference numerals are used to designate a preferred embodiment.

BRIEF DESCRIPTION OF THE PREFERRED EMBODIMENTS

DESCRIPTION OF THE PREFERRED EMBODIMENT

Figure 1:
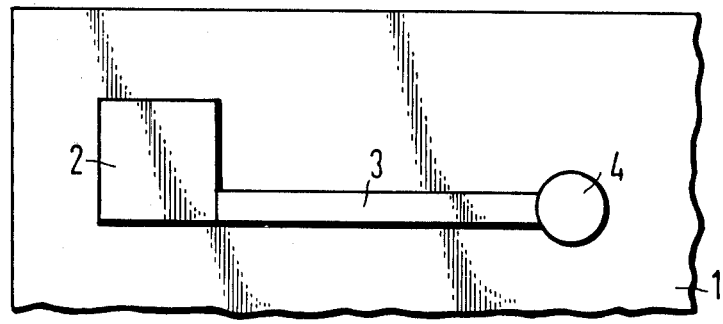
FIG. 1 shows a plan view of a portion of the wiring structure which is to be produced.

This invention relates to a process for producing multi-chip wiring on an insulation carrier which has outer contacts for additional wiring and connection surfaces for soldering semiconductor modules in the flip-chip-technique.

Generally semiconductor modules are encased in individual housings. Subsequent wiring is effected with a multi-layer printed circuit having metallized bores into which individual housing legs are soldered. However, individual housings occupy a relatively large amount of space on the wiring, and this involves high costs and, on account of the length of the electric connections, results in long access times.

The development of the flip-chip-technique has enabled the production of so-called multi-chip wirings having a high packing density. In addition to reducing space requirements, access times are also shortened on account of the shorter connection lines. The known multi-chip wirings which serve to accomodate housingless semiconductor modules with soft connection pads are produced in the thick-layer technique. In this technique, the connection surfaces on the carrier must be designed in such manner that when a semiconductor module has been soldered on, its connection pads, together with the cup-shaped solder coatings of the connection surfaces, form a cylindrical connection which ensures the greatest possible distance between the semiconductor module and the carrier.

This distance, which is approximately 80 to 120 $\mu$m, is necessary to accomodate expansion of the semiconductor module which results from heating. The height of the cup-shaped solder coatings on the connection surfaces of the carrier are exclusively dependent upon the geometry of the connection surfaces, and the connection surfaces are defined in relation to the associated conductor paths by a non-solderable barrier arranged transversely to the conductor paths.

Even slight deviations in the geometry of the connection surfaces result in differences in the height of the cup-shaped solder coatings which rules out reliable contacting of the semiconductor modules. Therefore with an increasing number of connection surfaces in thick-layer multi-chip wirings, the contacting yield decreases in a pronounced manner. In addition the low resolution of the silk-screen printing technique imposes narrow limits on the further miniaturization of connection surfaces and wiring. Consequently, in many cases expensive multi-layer wirings are required.

An important feature of the present invention is to provide a process for producing multi-chip wiring which facilitates high packing density and reliable flip-chip-connections.

In accordance with the invention, this aim is realized in a process of the type described in the introduction, in that an adhesive layer and a contacting layer are vapor deposited or spittered onto the carrier; the desired structure of the conductor paths, outer contacts and connection surfaces are covered with a conductive layer and an intermediate layer with the aid of a first photo-lacquer mask by galvanic metal deposition; that a solder-rejecting layer is galvanically deposited onto the structure of the conductor paths with the aid of a second photo-lacquer mask; and that then the undesired regions of the adhesive layer and of the contacting layer are etched away; and the outer contacts and connection surfaces are covered with a solderable contact layer by selective currentless metal deposition.

The multi-chip wiring produced in accordance with the present invention thus possesses conductor paths with a solder-rejecting layer on the surface and outer contacts and connection surfaces with a solderable contact layer on the surface. Thus the outer contacts and connection surfaces can be selectively coated with solder in a surge or dip bath without any danger of short-circuit due to the formation of solder bridges between the conductor paths. The connection surfaces are characterized by precisely reproducible dimensions. Their cup-shaped solder coatings thus possess only minimal differences in height which do not impair the reliability of the flip-chip-contacting. The intermediate layer prevents the metal of the contact layer from diffusing into the conductor layer and thus results in an increased reliability in continuous operation. Due to the fine resolution of the thin-film photo-technique, the packing density can be considerably increased in comparison to known thick-layer multi-chip wirings. This results in further advantages, such as short conduction paths, and thus shorter access times; lower costs for the subsequent wiring and a reduction in housing costs.

In addition, all semiconductor modules can be arranged in one wiring plane on the carrier, as a result of which it is easier to exchange defective semiconductor modules.

Advantageously, the adhesive layer is formed from titanium, and the contacting layer is formed from copper. In this case the titanium is characterized by its high adhesive capacity, and the copper by its good electric conductivity.

Preferably, the conductive layer is formed from copper, the intermediate layer from nickel and the solder-rejecting layer from chrome. The copper here is characterized by its good electric conductivity, whereas the nickel acts as a diffusion blocking layer and, in addition to its solder-rejecting property the chrome has a high degree of resistance to corrosion.

In a preferred embodiment of the process in accordance with the invention, the solderable contact layer is selectively deposited in a currentless gold bath operating by the ion-exchange principle, without previous masking. Gold has good electric conductivity, high resistance to chemical attack, and good wettability by solder material. Also, in the currentless gold bath, not only the outer contacts and connection surfaces, but also the flanks of the conductor paths are gold-plated except for the region of the solder-rejecting layer, so that all the regions of the multi-chip wiring are protected from corrosion.

In FIG. 1, a square outer contact 2, a conductor path 3 and a circular connection surface 4 are arranged on the surface of a ceramic carrier 1. The outer contact 2 is provided for multi-chip wiring, and the connection 4 is provided for the soldering of a semiconductor module in the flip-chip technique.

Figure 2:
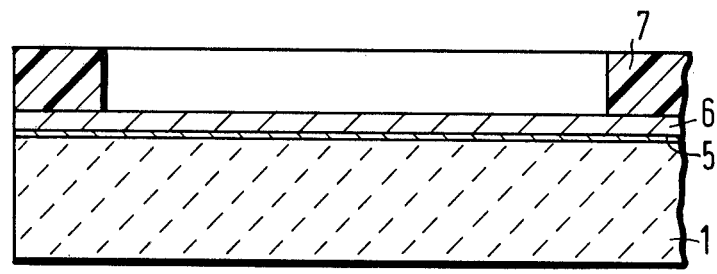
FIGS. 2 to 5 are sectional diagrams of the individual process steps used in producing the wiring structure shown in FIG. 1.

In accordance with FIG. 2, for the production of the wiring structure shown in FIG. 1, initially an approximately 70 nm thick adhesive layer 5 of titanium and then an approximately 700 nm thick contacting layer 6 of copper are vapor deposited or atomized onto the surface of the ceramic carrier 1 in a vacuum. Then the contacting layer 6 is provided with a first photo-lacquer mask 7 which forms a negative pattern of the wiring structure represented in FIG. 1.

Figure 3:
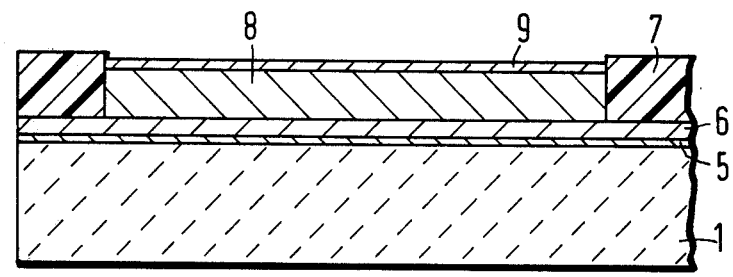

FIG. 3 shows the carrier 1 following the application of a conductive layer 8 and an intermediate layer 9 to the exposed regions of the contacting layer 6. The conductive layer 8 consists of copper and is approximately 10 $\mu$m thick, whereas the intermediate layer 9 consists of nickel and is approximately 3 $\mu$m thick. The conductive layer 8, and the intermediate layer 9 are applied galvanically in a copper bath and nickel bath respectively and the contacting layer 6 is in each case connected as a cathode.

Figure 4:
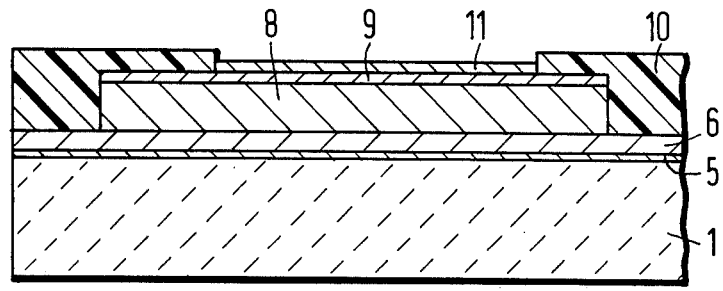

In accordance with FIG. 4, following the removal of the first photo-lacquer mask 7, a second photo-lacquer mask 10 is applied which exposes only the conductor paths 3 represented in FIG. 1. The conductor path surfaces are then covered with an approximately 200 nm thick, solder-rejecting layer 11 of chrome. The solder-rejecting layer 11 is applied galvanically in a chrome bath, with the contacting layer 6 again connected as a cathode.

In a variant of the process in accordance with the invention, the first photo-lacquer mask 7 is not removed and the second photo-lacquer mask is applied merely to the regions of the outer contacts 2 and the connection surfaces 4 (FIG. 1).

Figure 5:
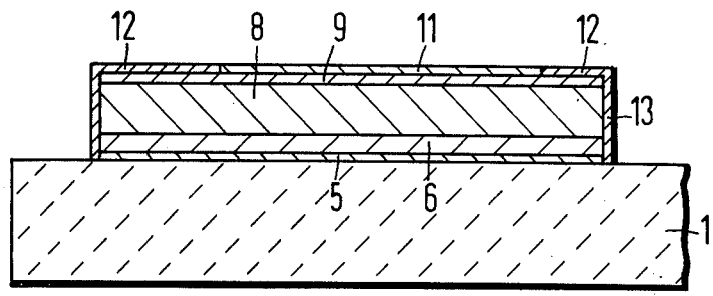

FIG. 5 shows the ceramic carrier 1 following the removal of the photo-lacquer mask 10 and the etching-away of the undesired zones of the adhesive layer 5 and the contacting layer 6. Following the etching, the outer contacts 2 and the connection surfaces 4 (FIG. 1) are covered with a solderable contact layer 12 by selective currentless metal deposition. The solderable contact layer 12 consists of gold and is approximately 100 to 500 nm thick. The currentless application of the solderable contact layer 12 is carried out in a gold bath, operating by the ion-exchange principle. In this gold bath the flanks of the wiring structure are simultaneously coated with a gold layer 13. The solder-rejecting layer 11, which consists of chrome, does not accept any gold in the gold bath.

Figure 6:
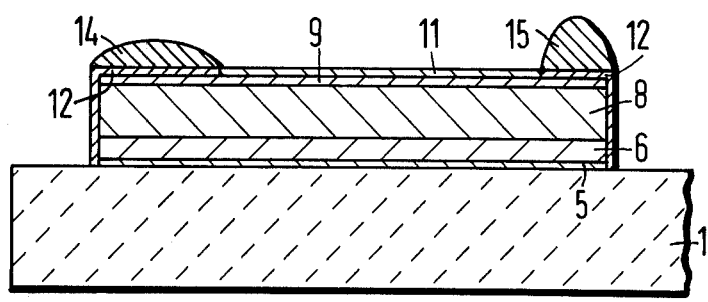
FIG. 6 shows a sectional view of the finished wiring structure after the dip-solder-coating of the outer contacts and connection surfaces, again in a sectional view.

FIG. 6 shows the finished multi-chip wiring arrangement after the carrier 1 has been dipped into a dip bath consisting of a lead-tin-alloy with 90% lead and 10% tin. In the dip bath the solderable contact layer 12 is coated with solder so that a layer of solder 14 forms on the outer contacts 2 (FIG. 1) and a cup-shaped layer of solder 15 forms on the connection surfaces 4 (FIG. 1).

In the above-described process, multi-chip wirings were produced for receiving by soldering four semiconductor components each with 22 connection pads. When the connection surfaces had a diameter of 150 $\mu$m, the height of all the cup-shaped solder coatings fluctuated between 28 and 31 $\mu$m. For contacting, the four semiconductor components which were to be connected were roughly positioned on the connection surfaces of the carrier, and then the carrier was passed through a continuous-heating furnace. During the melting-on of the solder of the connection pads of the semiconductor modules and of the cup-shaped solder coatings, the semiconductor modules were self-adjusted due to the surface tension of the liquid phase. When the connection pads of the semiconductor modules possessed a height of 80 $\mu$m, the distance between the semiconductor modules and the carrier amounted to approximately 90 $\mu$m. During subsequent endurance tests under considerable stress no evidence was obtained of a deformative destruction of the connection points between the semiconductor modules and the connection surfaces.

We claim:
1. A method for producing a multi-chip wiring arrangement having outer contacts for subsequent wiring and connection surfaces for being soldered to semiconductor modules in the flip-chip technique on an insulation carrier comprising the steps of:
   obtaining a suitable carrier layer,
   applying an adhesive layer and then a contacting layer onto a surface of the carrier,
   applying a photo mask to the surface of the contacting layer to leave outer contacts, connection surfaces and conductor paths exposed while masking other areas,
   metal depositing a conductive layer onto exposed areas of said contacting layer through said photo mask,
   metal depositing an intermediate layer onto said conductive layer,
   applying a second photo mask onto said intermediate layer to leave exposed the areas corresponding to said conductor paths,
   depositing a solder rejecting layer onto said conductor paths through said second photo mask,
   etching away the undesired regions of the adhesive layer and contacting layer, and
   covering the outer contacts and connection surfaces with a solderable contact layer.

2. A method in accordance with claim 1, wherein said first named photo mask is a photo-lacquer mask and wherein said conductive layer and intermediate layer are applied by galvanic metal deposition.

3. A method in accordance with claim 1, wherein said adhesive layer and contacting layer are applied by vapor deposition.

4. A method in accordance with claim 1, wherein said adhesive layer and contacting layer are sputtered onto the carrier.

5. A method in accordance with claim 1, wherein said solderable contact layer is applied to the outer contacts and connection surfaces by selective currentless metal deposition.

6. A method in accordance with claim 1, wherein said adhesive layer is formed from titanium and the contacting layer is formed from copper.

7. A method in accordance with claim 1, wherein the conductive layer consists of copper, the intermediate layer consists of nickel and the solder-rejecting layer consists of chrome.

8. A method in accordance with claim 1, wherein the solderable contact layer is selectively deposited in a currentless gold bath operating by the ion-exchange principle, without previous masking.

9. A method in accordance with claim 1, including the step of dipping the solderable contact layers in a solder bath to form solder layers on the surface thereof.

* * * * *